(12) United States Patent
Garten et al.

(10) Patent No.: US 11,335,845 B2
(45) Date of Patent: May 17, 2022

(54) HIGH BREAKDOWN STRENGTH FERROELECTRIC SRHFO₃ MATERIALS

(71) Applicants: Alliance for Sustainable Energy, LLC, Golden, CO (US); Lawrence Berkeley National Laboratory, Berkeley, CA (US); The Penn State Research Foundation, University Park, PA (US)

(72) Inventors: Lauren Marie Garten, Camp Springs, MD (US); David Samuel Ginley, Evergreen, CO (US); Kristin Aslaug Ceder-Persson, Orinda, CA (US); Shyam Sundar Dwaraknath, Berkeley, CA (US); Susan Trolier-McKinstry, State College, PA (US)

(73) Assignees: Alliance for Sustainable Energy, LLC, Golden, CO (US); The Regents of the University of California, Oakland, CA (US); The Penn State Research Foundation, University Park, PA (US)

( * ) Notice: Subject to any disclaimer, the term of this patent is extended or adjusted under 35 U.S.C. 154(b) by 535 days.

(21) Appl. No.: 16/255,069

(22) Filed: Jan. 23, 2019

(65) Prior Publication Data
US 2019/0229258 A1 Jul. 25, 2019

Related U.S. Application Data

(60) Provisional application No. 62/620,943, filed on Jan. 23, 2018.

(51) Int. Cl.
*H01L 41/187* (2006.01)
*H01L 41/316* (2013.01)
*C01G 27/00* (2006.01)
*C30B 23/02* (2006.01)
*C30B 29/22* (2006.01)
*C30B 23/06* (2006.01)
*C04B 35/48* (2006.01)

(52) U.S. Cl.
CPC .......... *H01L 41/1871* (2013.01); *C01G 27/00* (2013.01); *C04B 35/48* (2013.01); *C30B 23/02* (2013.01); *C30B 23/025* (2013.01); *C30B 23/066* (2013.01); *C30B 29/22* (2013.01); *H01L 41/316* (2013.01); *C01P 2002/70* (2013.01); *C01P 2002/90* (2013.01); *C01P 2004/04* (2013.01); *C01P 2006/40* (2013.01)

(58) Field of Classification Search
CPC ... H01L 41/316; H01L 41/1871; C30B 23/02; C30B 23/025; C30B 23/066; C30B 29/26; C04B 35/48; C01G 27/00
See application file for complete search history.

(56) References Cited

PUBLICATIONS

Curtarolo, S. et al., "Predicting Crystal Structures with Data Mining of Quantum Calculations," Physical Review Letters, vol. 91, No. 13, Sep. 26, 2003, pp. 135503-1 through 135503-4.
de Jong, M. et al., "A database to enable discovery and design of piezoelectric materials," Scientific Data, 2015, pp. 1-13.
Ding, H. et al., "Computational Approach for Epitaxial Polymorph Stabilization through Substrate Selection," ACS Applied Material Interfaces, vol. 8, 2016, pp. 13086-13093.
(Continued)

*Primary Examiner* — C Melissa Koslow
(74) *Attorney, Agent, or Firm* — Sam J. Barkley

(57) ABSTRACT

Methods for making metastable lead-free piezoelectric materials are presented herein.

12 Claims, 10 Drawing Sheets

(56) References Cited

PUBLICATIONS

Garten, L. et al., "Relaxor Ferroelectric Behavior in Barium Strontium Titanate," Journal of the American Ceramic Society, vol. 99, No. 5, pp. 1645-1650.

Jain, A. et al., "A high-throughput infrastructure for density functional theory calculations," Computational Materials Science, vol. 50, 2011, pp. 2295-2310.

Jain, A. et al., "Computational predictions of energy materials using density functional theory," Nature Reviews Materials, vol. 1, Jan. 2016, pp. 1-13.

Jain, A. et al., "Research Update: The materials genome initiative: Data sharing and the impact of collaborative ab initio databases," APL Materials, vol. 4, 2016, pp. 053102-1 through 053102-14.

Leung, C.M. et al., "Piezoelectric coefficient of aluminum nitride and gallium nitride," Journal of Applied Physics, vol. 88, No. 9, Nov. 1, 2000, pp. 5360-5363.

McDaniel, M. et al., "Atomic layer deposition of crystalline $SrHfO_3$ directly on Ge(001) for high-k dielectric applications," Journal of Applied Physics, vol. 117, 2015, pp. 054101-1 through 054101-9.

Muralt, P. et al., "Piezoelectric Thin Films for Sensors, Actuators, and Energy Harvesting," MRS Bulletin, vol. 34, Sep. 2009, pp. 658-664.

Saito, Y. et al., "Lead-free piezoceramics," Nature, vol. 432, Nov. 4, 2004, pp. 84-87.

Setter, N. et al., "Ferroelectric thin films: Review of materials, properties, and applications," Journal of Applied Physics, vol. 100, pp. 051606-1 through 051606-46.

Shrout, T. et al., "Lead-free piezoelectric ceramics: Alternatives for PZT?", Journal of Electroceram, vol. 19, 2007, pp. 111-124.

Singh, M. et al., "High-temperature phase transitions in $SrHfO_3$: A Raman scattering study," EPL, vol. 107, 2014, pp. 26004-p1 through 26004-p6.

Sousa, M. et al., "Optical properties of epitaxial $SrHfO_3$ thin films grown on Si," Journal of Applied Physics, vol. 102, 2007, pp. 104103-1 through 104103-6.

Vali, R., "Structural phases of $SrHfO_3$," Solid State Communications, vol. 148, 2008, pp. 29-31.

Zhao, J.L. et al., "Thickness dependence of piezoelectric property of ultrathin $BiFeO_3$ films," Physica B, vol. 407, 2012, pp. 2258-2261.

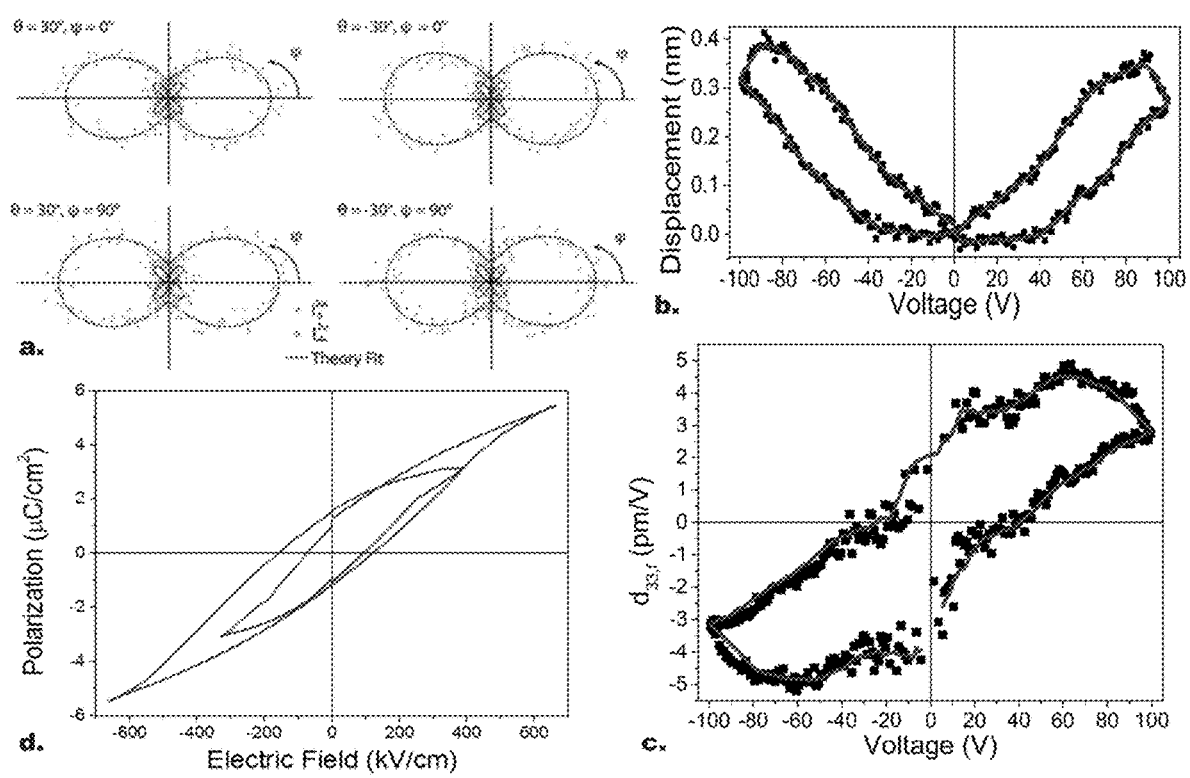
FIGs. 3a, 3b, 3c, and 3d

HIGH BREAKDOWN STRENGTH FERROELECTRIC SRHFO₃ MATERIALS

CROSS-REFERENCE TO RELATED APPLICATIONS

This application claims priority under 35 U.S.C. § 119 to U.S. Provisional Patent Application No. 62/620,943 filed on Jan. 23, 2018, the contents of which are hereby incorporated by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Materials discovery drives many new technology-driven advancements, from consumer products, to renewable energy. Many technologically critical materials are metastable under ambient conditions, yet the understanding of how to rationally design and guide the synthesis of these materials is limited.

SUMMARY

In an aspect, disclosed herein is a lead-free piezoelectric material capable of maintaining a piezoelectric response ($d_{33}$) of greater than about 5.2 pm $V^{-1}$ when subjected to an electric field of about 25 MV/cm. In an embodiment, the material is capable of a piezoelectric response ($e_{33}$) of at least 8.8 C $m^{-2}$. In an embodiment, the material has an average coercive field of about 83 kVcm$^{-1}$ and a remnant polarization of about 1.2 µCcm$^{-2}$. In an embodiment, the material is a metastable polymorph of SrHfO₃. In another embodiment, the material is a polymorph that is a P4 mm phase. In yet another embodiment, the material has a $e_{ij}^{max}$ of greater than 3 C m$^{-2}$. In an embodiment, the material is ferroelectric.

In an aspect, disclosed herein is a ferroelectric induced piezoelectric material having a piezoelectric response ($d_{33}$) of greater than about 5.2 pm $V^{-1}$ wherein the piezoelectric material includes a metastable SrHfO₃ polymorph with a P4 mm structure. In an embodiment, the material is a polymorph that has a breakdown strength of greater than about 25 MV/cm. In an embodiment, the material is capable of a piezoelectric response ($e_{33}$) of at least 8.8 C m$^{-2}$. In another embodiment, the material is grown on a substrate suitable for epitaxial growth of the polymorph. In yet another embodiment, the material has an average coercive field of about 83 kVcm$^{-1}$ and a remnant polarization of about 1.2 µCcm$^{-2}$. In an embodiment, the polymorph material is epitaxially stabilized by a substrate upon which the polymorph is grown. In an embodiment, the polymorph grows on a substrate that is SrTiO₃.

In another aspect, a method for making a lead-free piezoelectric material is disclosed that includes the steps of identifying a lead-free piezoelectric material having a piezoelectric tensor ($e_{ij}^{max}$) of greater than 3 C m$^{-2}$ by using density functional theory (DFT); and identifying a substrate that is capable of epitaxially stabilizing the piezoelectric material. In an embodiment, the method includes using pulsed laser deposition to grow epitaxial films from a SrHfO₃ target on a SrTiO₃ substrate. In an embodiment, the method includes at least one step wherein the growth takes place at a temperature of greater than about 450° C. In another embodiment, the method includes at least one step wherein the growth takes place at a total pressure of about 100 mTorr oxygen. In an embodiment, the method includes at least one step wherein the growth takes place by using a pulse rate of the laser of between about 10 and about 40 Hz. In another embodiment, the method produces a lead-free piezoelectric material has a breakdown strength of greater than about 25 MV/cm. In another embodiment, the method produces a lead-free piezoelectric material that is a film that is capable of a ferroelectric-induced large signal effective converse piezoelectric response of 5.2 pm $V^{-1}$. In yet another embodiment, the method produces a lead-free piezoelectric material that has a response of 5.2 pm $V^{-1}$ for a 35 nm film, wherein the film includes a metastable SrHfO₃ polymorph with a P4mm structure. In an embodiment, the method produces a lead-free piezoelectric material that has an average coercive field of about 83 kVcm$^{-1}$ and a remnant polarization of about 1.2 µCcm$^{-2}$.

Other objects, advantages, and novel features of the present invention will become apparent from the following detailed description of the invention when considered in conjunction with the accompanying drawings.

BRIEF DESCRIPTION OF THE DRAWINGS

FIG. 3a depicts second-harmonic generation (SHG) intensity polar plots measured with fixed θ and ψ, showing a 4 mm point group symmetry. FIG. 3b depicts displacement measured as a function of voltage measured by double beam laser interferometry. FIG. 3c depicts calculated $d_{33}$ from the displacement in FIG. 3a. FIG. 3d depicts ferroelectric polarization-electric field loop of the same material.

DETAILED DESCRIPTION

In an embodiment, disclosed herein is a metastable piezoelectric P4mm phase of SrHfO$_3$ that is stabilized at room temperature. In an embodiment, methods are disclosed herein that provide a theory-guided synthesis approach for the growth of metastable, DFT-predicted, lead-free, piezoelectric materials. In an embodiment, integration of an approach to synthesizability and functionality as disclosed herein is an advance in materials by design and should be applicable in a number of material systems.

Exemplary embodiments of the invention provide an integrated approach that targets a metastable lead-free piezoelectric polymorph of SrHfO$_3$. First-principles calculations by using DFT, predict that the previous experimentally unrealized, metastable P4mm phase of SrHfO$_3$ should exhibit a piezoelectric response (d$_{33}$) of 36.9 pC N$^{-1}$ (compared to d$_{33}$=0 for the ground state). Combining computationally optimized substrate selection and synthesis conditions lead to the epitaxial stabilization of the polar P4mm phase of SrHfO$_3$ on SrTiO$_3$. The films are structurally consistent with the theory predictions. A ferroelectric induced piezoelectric response of 5.2 pm V$^{-1}$ for a 35 nm film was observed, indicating the ability to predict and target multi-functionality. This illustrates a coupled theory-experimental approach to the discovery and realization of new multifunctional polymorphs.

Recent advances in computational techniques have significantly accelerated the prediction of promising multifunctional materials. Multifunctional materials perform multiple functions in a system and can replace and outperform combinations of traditional materials, thus potentially reducing size, weight, cost, power consumption, and complexity while improving efficiency. In this work, a route to synthesize a theoretically predicted, metastable, multifunctional material using theory guidance is described and the predicted piezoelectric and ferroelectric functionalities definitively verified.

Here, this approach is used to target high-response, lead-free piezoelectrics. Despite the technological importance of piezoelectrics, ranging from advanced medical instrumentation, to ultrasonic imaging systems, and compact actuators in industrial processes, there are only a handful of piezoelectric materials that are routinely used. Because most commercially important piezoelectric ceramics are lead-based materials, one of the most popular being Pb(Zr,Ti)O$_3$, there has been a longstanding challenge to find lead-free piezoelectric materials. Recently, others have used DFT to create a catalogue of piezoelectric tensors for 941 materials, with many of the predicted piezoelectric materials being lead-free and metastable.

Figure 1:
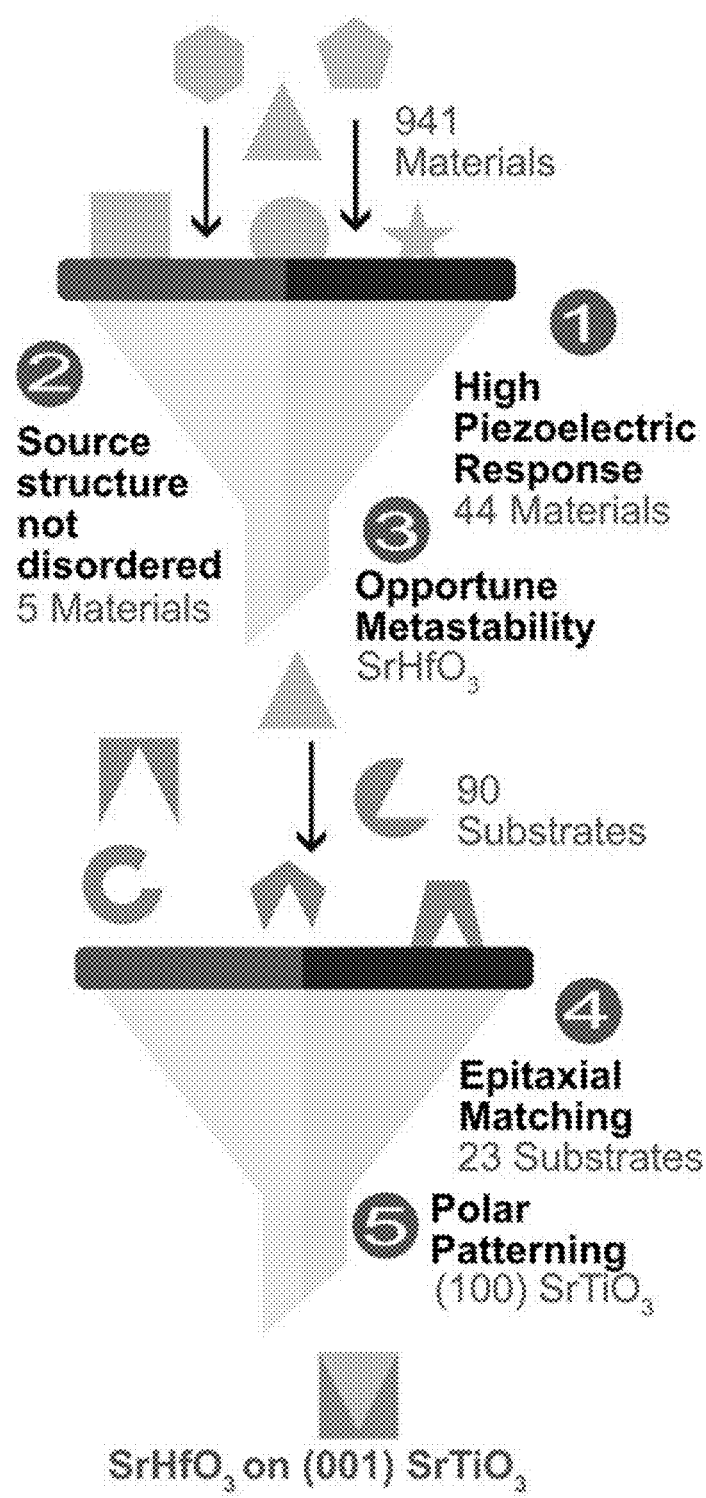
FIG. 1 is a schematic representation of methods disclosed herein, including the following steps: Step 1 uses a Density Functional Theory (DFT) algorithm to identify piezoelectric materials. Step 2 assesses the synthesizability of the material based on the origin of the compound. Step 3 identifies materials with low energy above hull, Step 4 then identifies effective substrates to stabilize the target materials. In an embodiment, the final step, step 5, identified SrTiO₃ as the most promising substrate for growth of a metastable SrHfO₃ polymorph with a P4mm structure, due to the structure, availability, and surface polarization of SrTiO₃.

Several materials in the materials project list exhibit potentially promising intrinsic piezoelectric behavior, which can be quantified by comparing the maximum component of the piezoelectric tensor (e$_{ij}^{max}$). FIG. 1 depicts the computational screening process that resulted in the identification of the SrHfO$_3$ as a possible novel, lead-free, high-performance piezoelectric. Over 900 piezoelectric materials were calculated, where 44 exhibit an e$_{ij}^{max}$ greater than 3 C m$^{-2}$ (the predicted piezoelectric e$_{ij}^{max}$ for PbTiO$_3$). Upon inspection of the top 44, five materials emerged as potential candidates because they were not derived from previously known materials. A hitherto experimentally unrealized tetragonal P4mm polymorph of SrHfO$_3$ was identified as a potentially promising lead-free piezoelectric material due to its strong calculated piezoelectric response of e$_{33}$=8.8 C m$^{-2}$, and because nanofabrication routes exist for other polymorphs of this material, opening up a number of new opportunities for piezoelectric electronics development. Theory predicts that if stabilized, the P4mm phase should also exhibit ferroelectricity, which should add another extrinsic contribution to the piezoelectric response.

Stabilizing a specific metastable polymorph can be challenging when a system presents strong polymorphism with small differences in metastability. The P4mm phase of SrHfO$_3$ is predicted to form 33 meV/atom above the ground state as defined by the convex hull, falling within the accessible range of synthesizable oxide polymorphs. However, there are four competing phases with energies less than the P4mm: the ground state Pnma structure, another orthorhombic (Cmcm), one tetragonal (I4/mcm) and one cubic (Pm3̄m). As disclosed herein, a previously developed combined lattice area and strain-matching algorithm was used to guide the substrate selection for epitaxial growth of the novel P4mm SrHfO$_3$ polymorph. Without being bound by theory, it was calculated that the substrate would epitaxially stabilize the P4mm structure over other competing polymorphs. By examining the match between all possible SrHfO$_3$ polymorphs with a set of the 90 most common substrates, 23 possible substrate interfaces that could grow P4mm SrHfO$_3$ were identified. From these substrates, (001) cubic SrTiO$_3$ was chosen because it is a stable oxide that meets these epitaxial criteria and is commercially available. A comparison of the strain energy and minimum lattice matching area for each SrHfO$_3$ polymorph enumerated above is shown in Table 1.

TABLE 1

The strain energy and minimum coincident area (MCIA) for experimentally realized and predicted polymorphs of SrHfO$_3$ on SrTiO$_3$ substrates (dashes indicate values were outside of the screening boundary conditions).

| Phase | Strain Energy (eV/Atom) | MCIA (Å$^2$) | Energy above Hull (eV/atom) | SrTiO$_3$ Orientation |
|---|---|---|---|---|
| Pnma | — | — | 0 | |
| Imma | — | — | 0.003 | |

TABLE 1-continued

The strain energy and minimum coincident area (MCIA) for experimentally realized and predicted polymorphs of SrHfO$_3$ on SrTiO$_3$ substrates (dashes indicate values were outside of the screening boundary conditions).

| Phase | Strain Energy (eV/Atom) | MCIA (A$^2$) | Energy above Hull (eV/atom) | SrTiO$_3$ Orientation |
|---|---|---|---|---|
| Cmcm | — | — | 0.004 | |
| I4/mcm | — | — | 0.006 | |
| P4/mbm | 0.199 | 265.2 | 0.013 | <100> |
| P4mm | 0.023 | 154.2 | 0.033 | <001> |
| Pm-3m | 0.016 | 154.3 | 0.033 | <001> |

Figure 4:
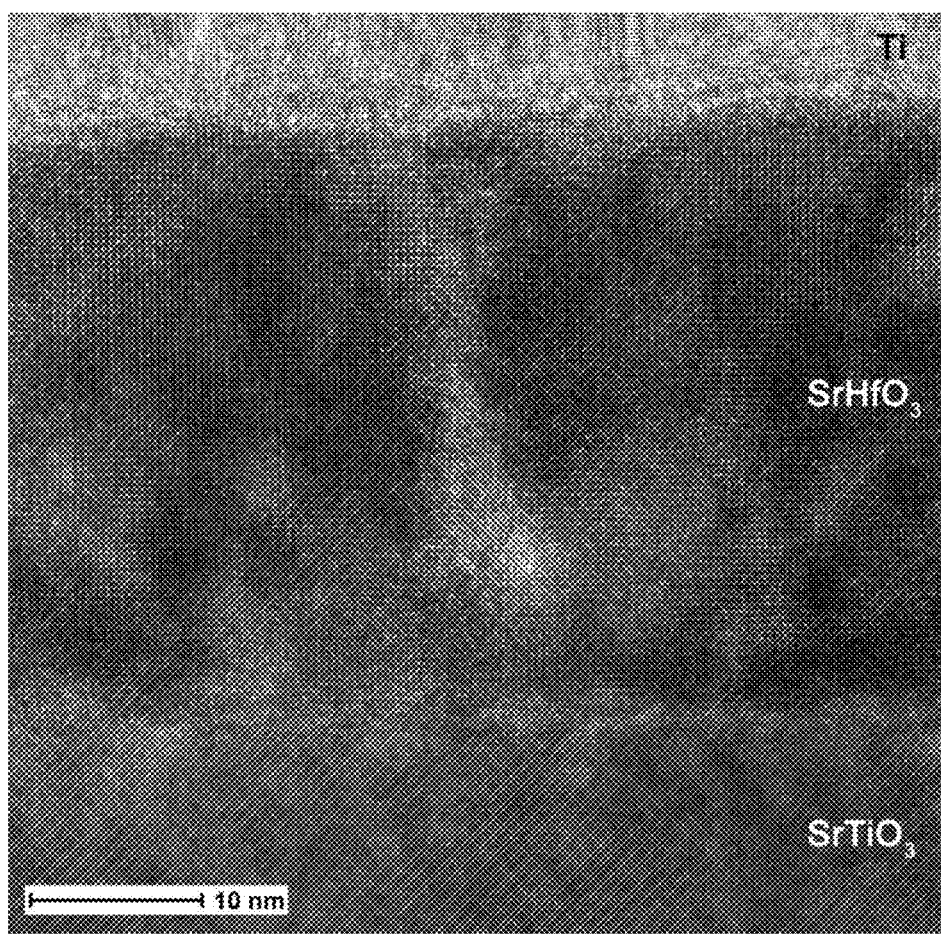
FIG. 4 depicts a transmission electron microscopy (TEM) micrograph of 35 nm thick SrHfO₃ film grown epitaxially on (001) SrTiO₃ single crystal substrate.

Pulsed laser deposition was used to grow epitaxial thin films from a SrHfO$_3$ target on SrTiO$_3$ single crystals substrates (and Nb-doped SrTiO$_3$ substrates for electrical measurements). In an embodiment, a preferred film thickness for correct phase formation was found to be approximately 35 nm, similar to that in the transmission electron micrograph of a 35 nm SrHfO$_3$ film grown epitaxially on (001) SrTiO$_3$ single crystal substrate depicted in FIG. 4.

Figures 2A, 2B:
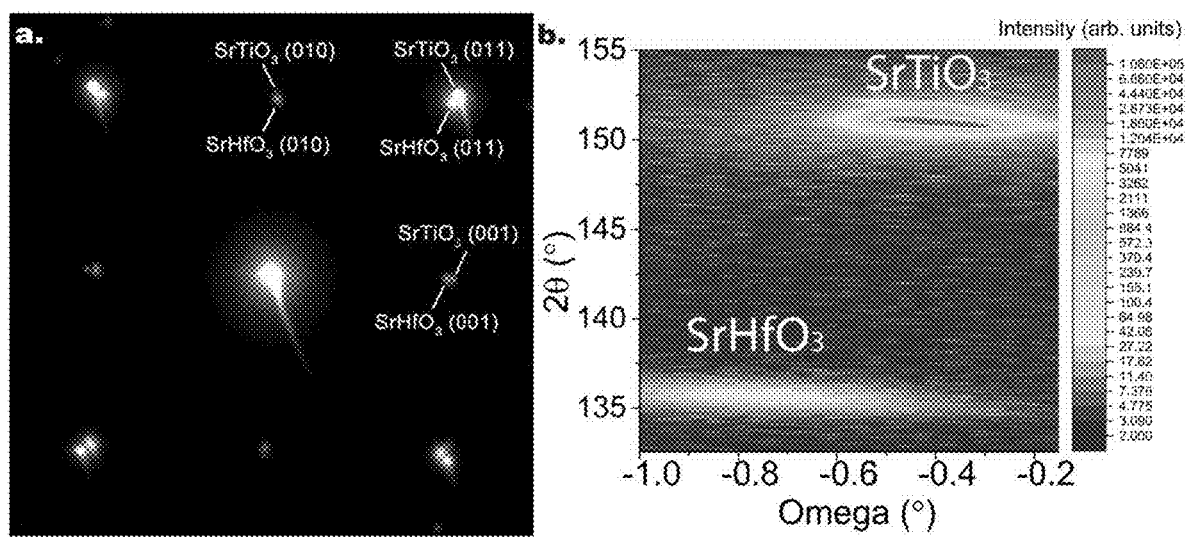
FIG. 2a depicts a selected area electron diffraction (SAED) pattern of a SrHfO₃ thin film (white) on (001) SrTiO₃ single crystal substrate (yellow), looking down the [100] zone axis.
FIG. 2b. depicts reciprocal space mapping x-ray diffraction (RSM-XRD) of the same material depicted in FIG. 2a and shows the (224) SrHfO₃ and SrTiO₃ peaks.
Figure 5:
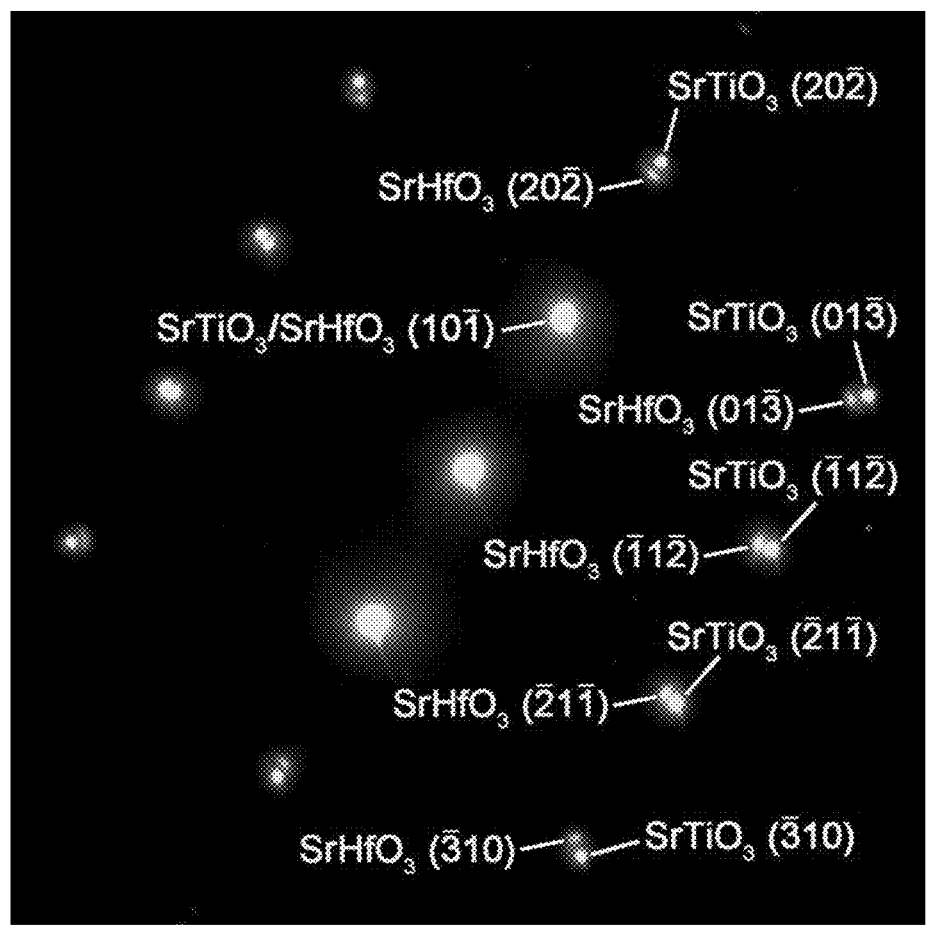
FIG. 5 depicts selected area electron diffraction of a SrHfO₃ thin film (white) on (001) SrTiO₃ single crystal substrate (yellow), viewing down the [131] zone axis. The absence of reflections from other orthorhombic and tetragonal SrHfO₃ polymorphs further confirms the P4mm structure.

Phase formation was assessed by selected area electron diffraction (SAED), and reciprocal space mapping—X-ray diffraction (RSM-XRD). SAED down the [100] zone axis of a 35 nm thick SrHfO$_3$ thin film grown at 550° C. on a 0.7 wt % niobium-doped SrTiO$_3$ single crystal is shown in FIG. 2a. The outer spots originate from the SrTiO$_3$ substrate, which has a cubic (Pm$\bar{3}$m) structure. Interior to these reflections is an analogous set attributed to the epitaxial SrHfO$_3$ film due to its larger in-plane lattice parameters relative to SrTiO$_3$. Coincident alignment of the (001) and (011) reflections between the substrate and film indicate a fully epitaxial relationship and alignment of the b axes. Compressive in-plane stresses due to lattice matching of the SrHfO$_3$ film to the SrTiO$_3$ substrate can induce a Poisson effect, causing an expansion of the out-of-plane c-axis lattice parameter. Thus, the symmetry of the reflections in FIG. 2a is consistent with this hypothesis and the P4mm structure, with c:b=1.002+/−0.0015 and the c-axis of SrHfO$_3$ parallel to the growth direction. To further verify the P4mm structure against the other possible polymorphs, SAED was acquired down the [131] zone axis, shown in FIG. 5. Using reflections from the [131] zone axis and measured b and c from the [100] zone axis, an a:b=1.000+/−0.0015 was quantified. Furthermore, all additional reflections associated with other polymorphs of SrHfO$_3$ are absent, again confirming the presence of the P4mm tetragonal phase.

Figure 6:
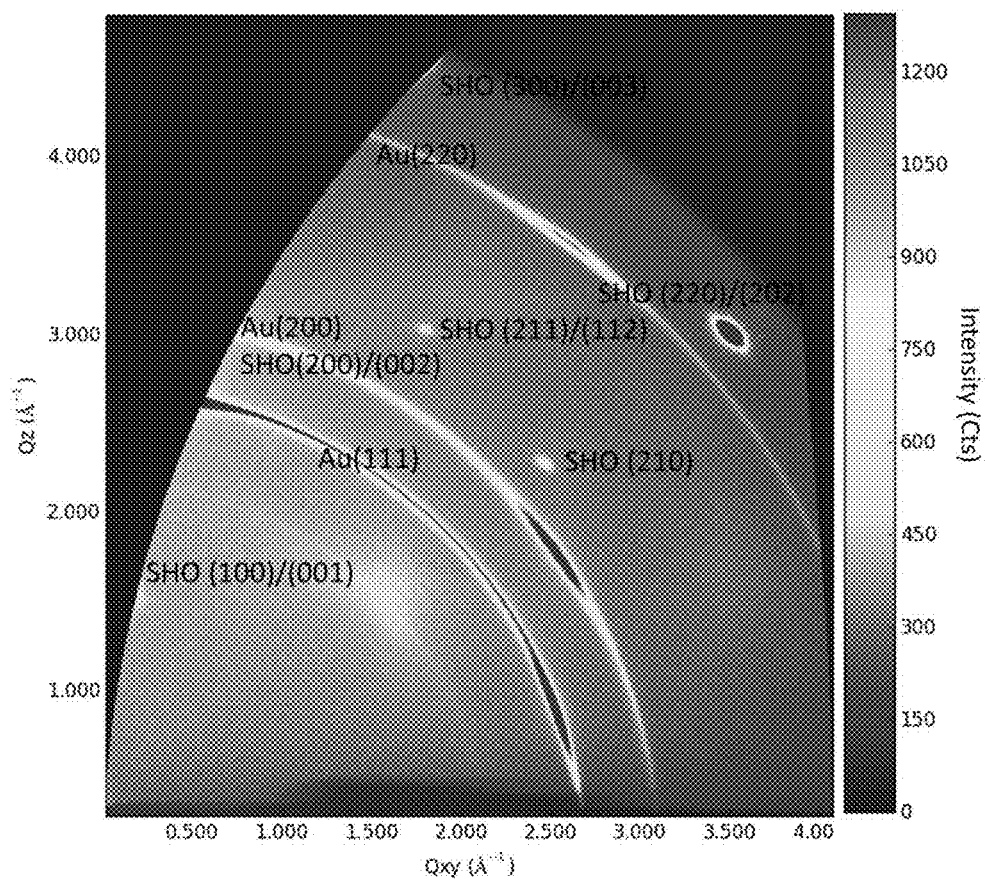
FIG. 6 depicts 2D Wide Angle X-ray Scattering: one quadrant of a 2D XRD pattern from a select SrHfO₃ sample. SrHfO₃ peaks are indexed to the P4mm structure and reflections from the Au electrodes are also identified. This data shows an (100) out-of-plane orientation of the SrHfO$_3$ film. The data is plotted versus Q, where Q=4 sin and Q=0.9744 Å.

RSM-XRD and synchrotron X-ray diffraction further corroborates the structure determination by SAED. RSM-XRD of the (100), (113), and (224) planes was measured. A reciprocal space map for the (224) is shown in FIG. 2b. The difference in the omega position for the substrate and SrHfO$_3$ film indicate that the film has partially relaxed. The structure determination is supported by 2D wide angle X-ray scattering, showing reflections consistent with those measured by RSM-XRD shown in FIG. 6. The experimentally observed c:a lattice parameter ratio is identical with the Materials Project calculations, with c:a=1.002 for the measured and predicted structure. The calculated lattice parameters from the RSM-XRD measurement are a=b=4.079+/−0.005 Å and c=4.087+/−0.005 Å, which is in close agreement with the SAED estimates.

Figure 7:
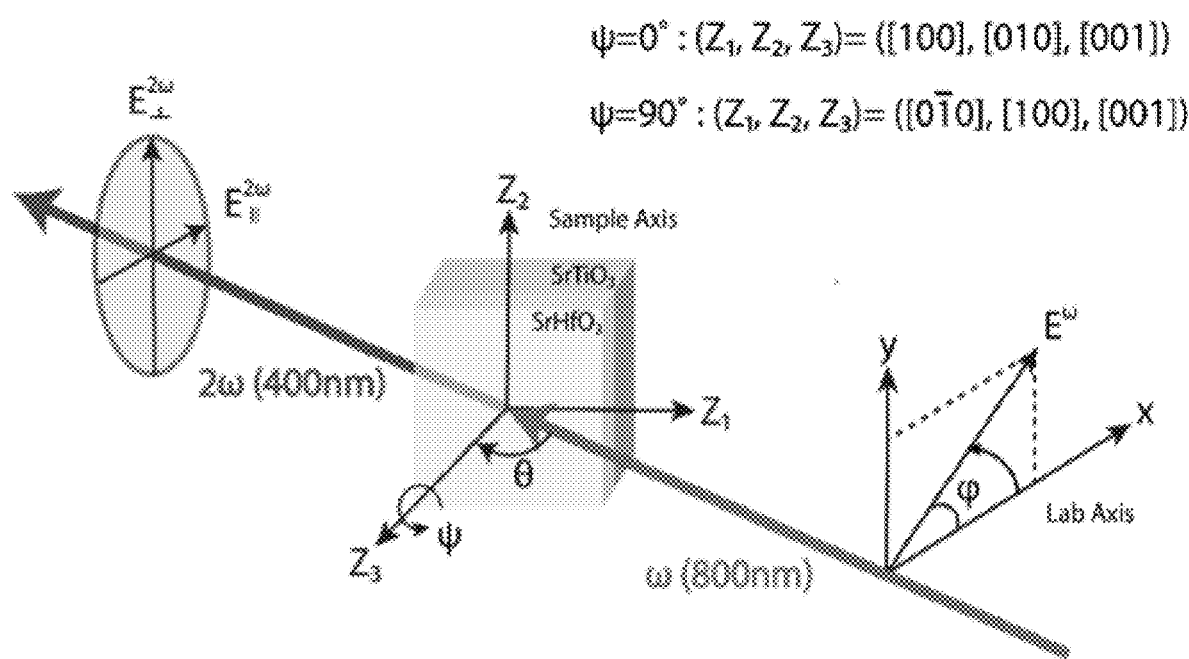
FIG. 7 depicts the SHG setup with a schematic drawing of transmission SHG polarimetry setup. The lab axis and the sample axis are defined as (x,y,z) and (Z$_1$, Z$_2$, Z$_3$), respectively, and crystallographic directions of the substrate are defined in terms of the sample axis. The fundamental beam of polarization φ is incident on the sample of tilt angle θ and the orientation angle of ψ. The incident light beam of frequency w interacts with SrHfO$_3$ (non-centrosymmetric media) and is converted into a beam of frequency 2ω. The second harmonic field generated by the sample is then divided into vertical and horizontal components, and their intensity is measured.

Second harmonic generation (SHG) was used to definitively identify the presence of the polar P4mm SrHfO$_3$ phase. SHG is often used to provide insight into the symmetry breaking in polar materials, as SHG is only seen in materials that lack a center of symmetry. Using optical SHG polarimetry analysis, the point group symmetry of the SrHfO$_3$ films was identified. FIG. 7 depicts a schematic drawing of transmission SHG polarimetry used in the study. FIG. 3a depicts SHG polar plot measurements taken at over a range of different angles; either fixed θ (−30 and 30) or fixed ψ (0 and 90). All of the SHG polar plots were fitted simultaneously, revealing that SrHfO$_3$ has 4 mm point group symmetry, in agreement with the predicted P4mm tetragonal polymorphic phase of SrHfO$_3$.

In order to fully demonstrate the integrated approach combining synthesizability and functionality, the electromechanical response of these SrHfO$_3$ films was assessed. The DFT predicted d$_{ij}$ piezoelectric tensor is shown in Table 2, with the e$_{ij}$ piezoelectric coefficients in Table 3.

TABLE 2

The DFT calculated d$_{ij}$ piezoelectric tensor for SrHfO$_3$ (pC/N).

$$\begin{bmatrix} 0 & 0 & 0 & 0 & 58 & 0 \\ 0 & 0 & 0 & 58 & 0 & 0 \\ -7.4 & -7.4 & 36.9 & 0 & 0 & 0 \end{bmatrix}$$

TABLE 3

Density functional perturbation theory calculated e$_{ij}$ piezoelectric tensor for P4 mm SrHfO$_3$ in units of (C/m$^2$).

Piezoelectric Tensor e$_{ij}$ (C/m$^2$)

$$\begin{bmatrix} 0.00000 & 0.00000 & 0.00000 & 0.00000 & 8.12076 & 0.00000 \\ 0.00000 & 0.00000 & 0.00000 & 8.12076 & 0.00000 & 0.00000 \\ -0.23667 & -0.23667 & 8.72945 & 0.00000 & 0.00000 & 0.00000 \end{bmatrix}$$

In order to vet the piezoelectric predictions, direct piezoelectric and dielectric measurements were made via a double beam laser interferometer. Initial small signal sweeps did not produce a significant piezoelectric response. However, after the application of an electric field of 220 kV cm$^{-1}$ to reorient the polarization through the thickness of the films, a measurable displacement was observed. The measured piezoelectric displacement as a function of applied voltage for a single measurement (black), and the average of ten measurements (blue) is shown in FIG. 3b. Hysteresis in the response as a function of the voltage history, and the offset in the forward and reversed sweep indicate that this is a ferroelectric-induced piezoelectric response and not solely due to electrostriction. The effective d$_{33,f}$ piezoelectric response, depicted in FIG. 3c was calculated from these displacement measurements. The measurements show a maximum of 5.2 pm V$^{-1}$, which is in reasonable agreement with predictions of piezoelectricity in this material. The fact that the measured response is lower than the predicted values is likely due to a combination of substrate clamping, in-plane strain and scaling effects in thin films, as the piezoelectric response is known to decrease rapidly for films thinner than 100 nm.

Figure 8:
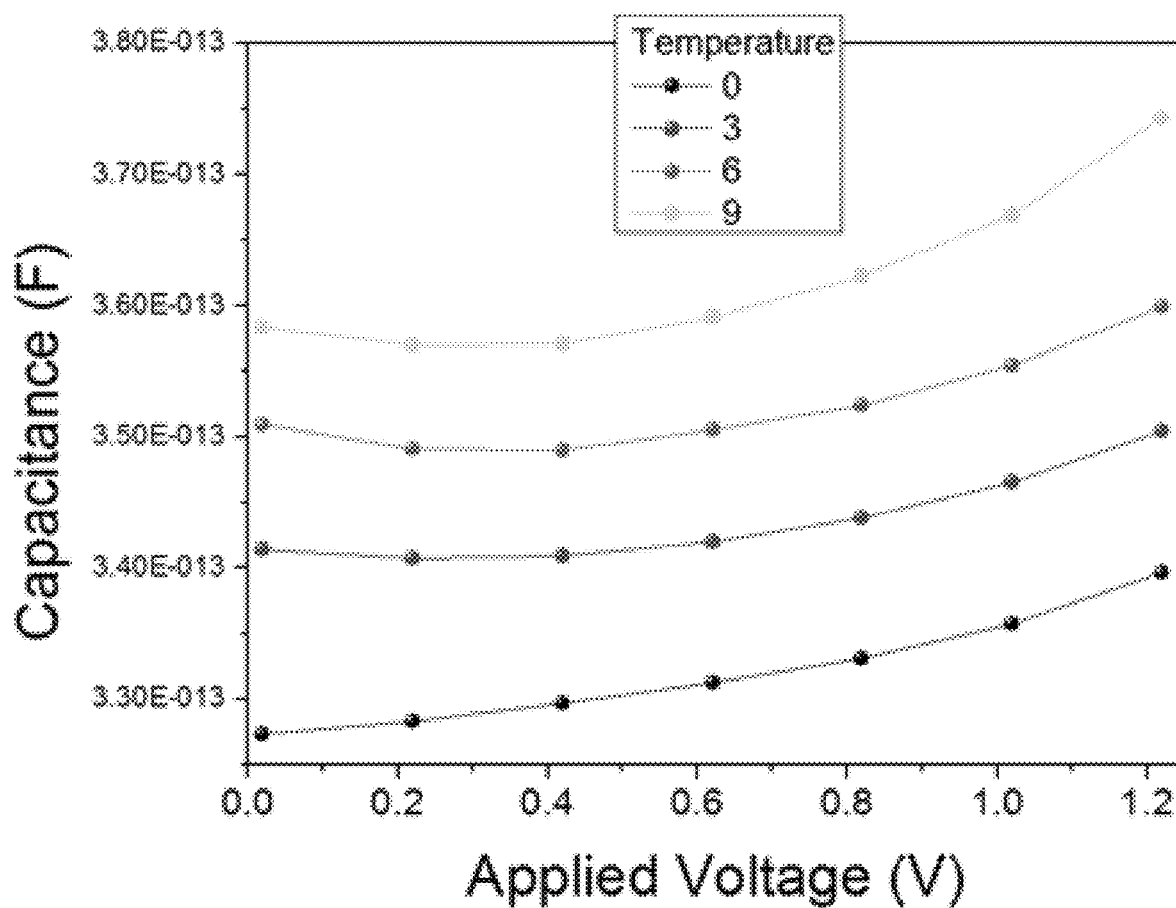
FIG. 8. The Rayleigh response for an SrHfO$_3$ film taken from 0-9° C., showing a positive slope for all scans.

These SrHfO$_3$ films exhibit a ferroelectric enhanced piezoelectric response, further confirming the predictions of ferroelectricity in these materials. FIG. 3d shows the polarization-electric field (PE) response for a representative SrHfO$_3$ film. The average coercive field, and remnant polarization are 83 kVcm$^{-1}$ and approximately 1.2 μCcm$^{-2}$ respectively. The pinching could be related to the rapid rate of deposition introducing defects in the film. Rayleigh analysis provides further support for the contribution of ferroelectric domain walls to the piezoelectric response in the SrHfO$_3$ films. The Rayleigh response is the linear change in permittivity under an applied electric field, $E_{AC}$, due to the irreversible movement of ferroelectric domain walls, domain clusters, or phase boundaries. The Rayleigh response as a function of temperature is shown in FIG. 8. A positive Rayleigh response is observed for all temperatures measured between −20° C. and 50° C. The Rayleigh response was fit to the minor PE-loops and found to be in good agreement. This indicates that the films have mobile boundaries that also contribute to the piezoelectric response.

Figure 10:
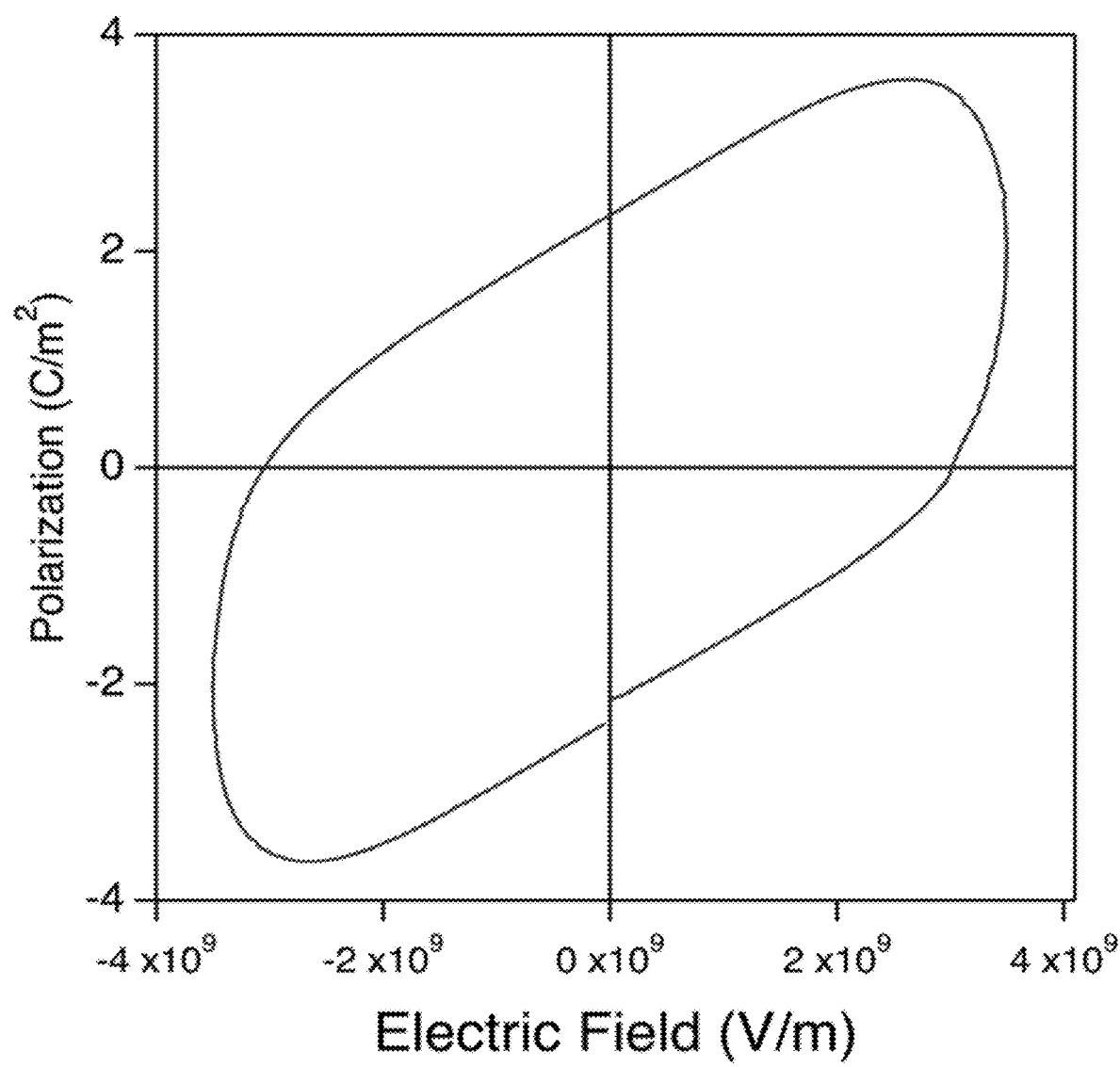
FIG. 10 depicts a polarization-electric field measurement of SrHfO$_3$ taken at 100 Hz. The data depicted in FIG. 10 is the average of 10 consecutive loops. As depicted in FIG. 10, a 40 nm SrHfO$_3$ film withstood 140 V, which is an electric field of approximately 35 MV/cm.

FIG. 10 depicts a polarization-electric field measurement of SrHfO$_3$ taken at 100 Hz. This data is the average of 10 consecutive loops. A 40 nm SrHfO$_3$ film withstood 140 V, which is an electric field of approximately 35 MV/cm. These results in conjunction with the large signal d$_{33}$ measurements show that SrHfO$_3$ is capable of withstanding very high electric fields and thus has a high breakdown strength. Because of this, these materials are of interest for high energy density dielectric applications or any similar application requiring a high breakdown strength.

The ability to rapidly identify and synthesize lead-free piezoelectric materials, as was achieved here, represents a step towards developing new multifunctional materials. Rapidly proposing and producing new functional materials will have an impact on number applications such as: medical transducers, energy harvesters and sensors, and electrical components. As disclosed herein, the ability to integrate SrHfO$_3$ with silicon nanofabrication, suggests that these materials are good candidates for dielectric energy storage or ferroelectric memory.

Theory: The first-principles results presented herein were performed using the projector augmented wave (PAW) method as implemented in the Vienna Ab Initio Simulation Package (VASP). All calculations used the Perdew, Becke and Ernzerhof (PBE) Generalized Gradient Approximation (GGA) for the exchange-correlation functional. The cut-off for the plane waves was 1000 eV and a uniform k-point density of 2,000 per reciprocal atom (pra) was used, which means that the number of atoms per cell multiplied by the number of k-points equals approximately 2,000. The ferromagnetic and non-magnetic states were converged in this way, but not the anti-ferromagnetic states. Due to the presence of strongly correlated electrons in some of the oxides, the GGA+U method was used, with U representing the Hubbard-parameter. The values of U are chosen consistent with those used in MP.

Thin film growth: Thin films of SrHfO$_3$ were deposited from a SrHfO$_3$ target (99.99% Materion) onto (100) oriented 0.7 wt % Nb-doped and undoped SrTiO$_3$ single crystal substrates (MTI Corp.) and platinum coated silicon (MTI Corp.) substrates by pulsed laser deposition. The PLD system used a 248 nm KrF laser, laser energy of 400 mJ and pulse frequencies of 40 Hz. The target substrate distance was 10 cm. Optimal films were deposited at temperatures from 500-750° C. and pO$_2$ of 10$^{-1}$ Torr.

Transmission Electron Microscopy: TEM micrographs are acquired with a FEI Co. Talos F200X transmission electron microscope operating at an accelerating voltage of 200 keV. Specimens for TEM were prepared from deposited films via in-situ focused ion beam lift-out methods using a FEI Co. Helios Nanolab 600i SEM/FIB DualBeam workstation. Specimens were ion milled at 2 keV and 77 pA to minimize Ga ion beam damage and achieved a final thickness of approximately 80 nm. Structural characterization was conducted by acquiring selected area electron diffraction (SAED) patterns on a FEI Co. Ceta 16M pixel CMOS camera at a camera length of 410 mm. The SrTiO$_3$ single crystal substrate was used to calibrate the camera constant, allowing SAED reflections to be accurately measured and indexed.

Reciprocal Space Mapping X-ray diffraction: High-resolution X-ray diffraction of the films was performed on a Rigaku Smartlab X-ray diffractometer using a 2xGe(220) monochromator and a Hypix 2d detector operated in 1D mode. Reciprocal space maps used a 2xGe(220) analyzer crystal.

Second Harmonic Generation-Experimental Setting: Transmission SHG polarimetry measurements were performed in a far-field transmission configuration with 800 nm fundamental laser beam generated by Empower 45 Nd:YLF Pumped Solstice Ace Ti: Sapphire femtosecond laser system, with pulse width of 95 fs and repetition rate of 1 kHz.

Piezoelectric, and ferroelectric measurements: Polarization-electric field hysteresis measurements (see FIG. 10) were made with a Precision Multiferroic Precision Materials Analyzer (Radiant Technologies Inc., Albuquerque, N. Mex.) using a triangular wave form driving electric field signal and a frequency of 100 Hz. A maximum voltage of 100 V was applied. To reach the maximum voltage magnitude, hysteresis loop cycles were run consecutively with incrementally increasing electric field magnitude in 50 kVcm$^{-1}$ intervals.

Piezoelectric coefficients ($d_{33,f}$) were measured using an axiACCT double beam laser interferometer (DBLI) system with a TF Analyzer 2000 for polarization and current measurement. The $d_{33,f}$ piezoelectric response was taken after poling at 220 kV cm$^{-1}$ voltage for 15 minutes.

The strain-temperature phase diagram was obtained by minimizing the total Gibbs free energy including the elastic strain energy. The temperature dependence of the Gibbs free energy was obtained by fitting the energy of volumetric deformations to the Vinet equation of state. The elastic energy was fit to the lowest area matching interface at each strain, allowing for discontinuous transitions from one matching interface to another to account for change in deformation mode as higher strains are allowed.

Figure 9:
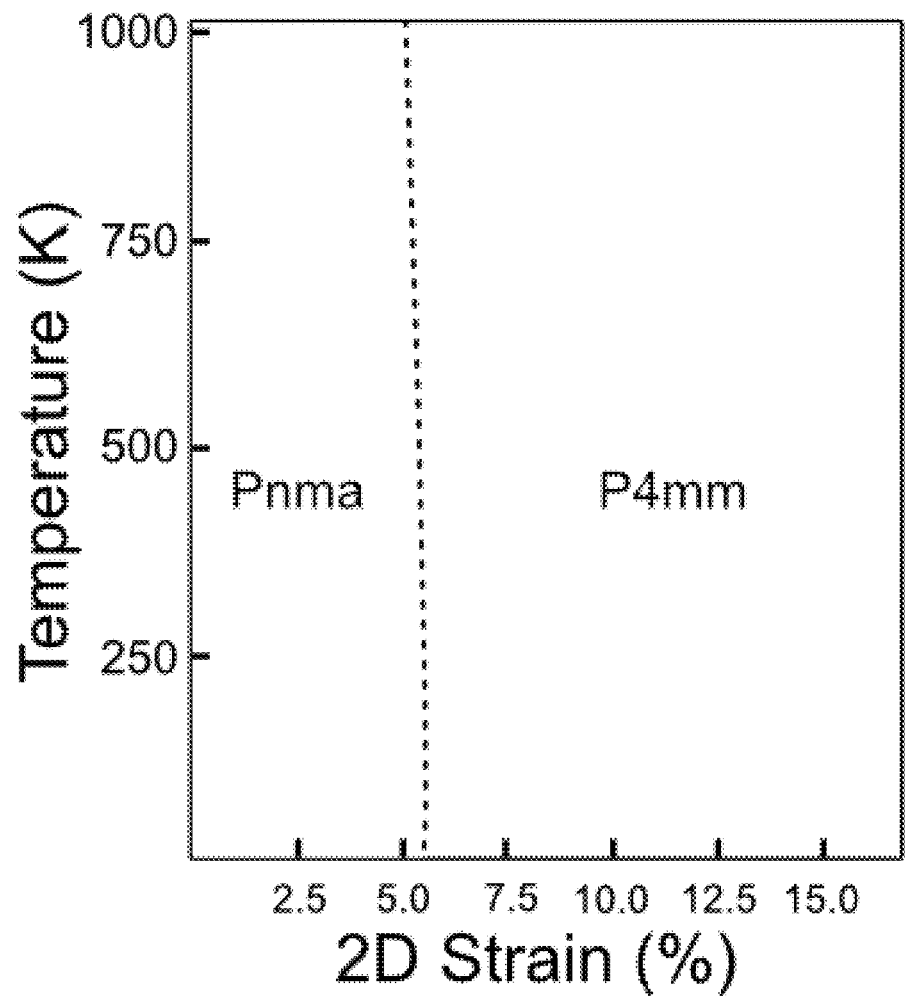
FIG. 9 depicts the predicted strain-temperature phase diagram for a SrHfO$_3$ system.

Stabilization of target polymorphs: In order to guide the epitaxial stabilization of SrHfO$_3$, the influence of substrate strain and temperature on the phase formation were assessed to identify the region of stability and processing routes. FIG. 9 depicts the resulting theoretical strain/temperature phase diagram that suggests that at a critical strain of 5.4% is sufficient to stabilize the target polymorph for the considered temperature range. The difference in computationally determined lattice parameters between the SrTiO$_3$ and the predicted in-plane lattice parameters of the P4mm SrHfO$_3$ a=b=4.139 Å at 0 K leads to an epitaxial strain of approximately 3.5% for SrHfO$_3$ on SrTiO$_3$. While not sufficient to stabilize the polar phase on its own, epitaxial induced 2D in-plane strain tends to stabilize the P4mm phase, and the additional weakly polar interface of a SrTiO$_3$ substrate is expected to favor P4mm SrHfO$_3$. Hence, the SrTiO$_3$ substrate was used to preferentially target the polar P4mm polymorph and guide the processing temperatures during deposition, with the goal of maintaining the P4mm as a metastable phase at lower temperatures.

Synchrotron and RSM X-ray diffraction: 2D wide-angle XRD were measured at the Stanford Synchrotron Radiation Lightsource beamline 11-3 in grazing incidence geometry with an incidence angle of 2°, and λ=0.9744 Å. 2D scattering data were collected with a Rayonix CCD detector and calibrated using a LaB6 standard. For the RSM-XRD, symmetric rocking curves of the 001, 113 and 224 peaks were taken. The significantly more intense peak in FIG. 2b at $\Omega=-0.4°$ and $2\theta=150.93°$ is the STO substrate, the second peak at $\Omega=-0.758°$ and $2\theta=135.56°$ is from the SrHfO$_3$. The low intensity and peak width are in largely due to the small thickness of the film. The relative peak positions indicate that the SrHfO$_3$ is partially relaxed.

Second Harmonic Generation Experiment: A schematic for the far-field transmission SHG configuration is depicted in FIG. 7. The fundamental 800 nm laser beam is incident on the SrHfO$_3$ thin film layer with the tilt angle of $\theta$, which is defined by the sample normal and the wave vector of incident fundamental beam. The orientation of the sample is determined by $\psi$, which represents in-plane rotation of the thin film/substrate. The polarization state of the light is defined by $\varphi$, which is rotated from 0° to 360° by $\lambda/2$ wave plate, with a step size of 2°. The second harmonic electric field (400 nm) generated by the thin film goes through the two interfaces, that are thin film-substrate and the substrate-air interfaces, then separated into vertical ($E_\perp^{2\omega}$) and horizontal ($E_\parallel^{2\omega}$) components by polarized beam-splitter, then the intensity of each component is measured by a photomultiplier tube (PMT). The SrHfO$_3$ thin film grown in SrTiO$_3$ (STO) [001] substrate was measured. It has previously been reported that strain-free SrTiO$_3$ generates SHG signal. To ensure that there is no SHG signal from the substrate, the measurements were taken after the SHG signal from SrTiO$_3$ substrate was nullified by de-focusing of the incident beam or attenuation filter.

Theoretical Modeling of SHG polarimetry: The theoretical modeling of SHG polar plots was done by using the following methods. The second order nonlinear optical d tensor ($d_{ijk}$) can be calculated by applying linear orthogonal transformation (LOT) and Neumann's Principle. The third rank d tensor then further simplified with Voigt notation ($d_{ij}^{Voigt}$) to 3×6 matrix. With the symmetry elements with respect to the sample axis ($Z_1$, $Z_2$, $Z_3$) and the rules listed above, the 4 mm point group in the 2 orientations ($\psi=0°$, 90°) have the same form of SHG second order nonlinear optical d tensor:

$$d_{ij,s}^{Voigt} = \begin{pmatrix} 0 & 0 & 0 & 0 & d_{15} & 0 \\ 0 & 0 & 0 & d_{15} & 0 & 0 \\ d_{31} & d_{31} & d_{33} & 0 & 0 & 0 \end{pmatrix}$$

Where subscript s denotes d tensor in the sample axis. The fundamental beam ($E^\omega$) has components of ($E_0 \cos \varphi$, $E_0 \sin \varphi$, 0) with respect to the lab axis (x,y,z) with an incident angle of $\theta$. Inside the sample, the fundamental beam turns into $$E_{i,s}^\omega = \begin{pmatrix} E_{1,s}^\omega \\ E_{2,s}^\omega \\ E_{3,s}^\omega \end{pmatrix} = \begin{pmatrix} [t_p \cos(\theta')\cos(\psi)\cos(\varphi) - t_s \sin(\psi)\sin(\varphi)]E_0 \\ [t_p \cos(\theta')\sin(\psi)\cos(\varphi) + t_s \cos(\psi)\sin(\varphi)]E_0 \\ -t_p \sin(\theta')\cos(\varphi)E_0 \end{pmatrix}$$

Where $\theta'$ is the refracted angle given by $\sin(\theta')=\sin(\theta)/n_1$, $n_1$ is the refractive index of SHO, and $t_p = 2\cos(\theta)/[n_1 \cos(\theta)+\cos(\theta')]$, $t_s = 2\cos(\theta)/[\cos(\theta)+n_1 \cos(\theta')]$ are Fresnel's coefficients for the amplitude ratio of incident and refracted beam in the air-film interface. The refractive index of SHO which is $n_1=2.07$. For the simplicity of analysis, the index dispersion is ignored, that is, $n_\omega \approx n_{2\omega}$. The generated second harmonic electric field inside the sample is given by $E_{i,s}^{2\omega} = d_{ij,s}^{Voigt} \cdot E_{i,s}^{\omega,Voight}$, where $E_{i,s}^{\omega,Voigt}$ is the fundamental electric field inside the sample in terms of Voigt notation. In the lab axis, the transmitted second harmonic field is given by $$E_i^{2\omega} = \begin{pmatrix} E_1^{2\omega} \\ E_2^{2\omega} \\ E_3^{2\omega} \end{pmatrix} = \begin{pmatrix} t_p'[E_{1,s}^{2\omega}\cos(\theta')\cos(\psi) + E_{2,s}^{2\omega}\cos(\theta')\sin(\psi) - E_{3,s}^{2\omega}\sin(\theta')] \\ t_s'[-E_{1,s}^{2\omega}\sin(\psi) + \cos(\psi)] \\ t_p'[E_{1,s}^{2\omega}\sin(\theta')\cos(\psi) + E_{2,s}^{2\omega}\sin(\theta')\sin(\psi) + E_{3,s}^{2\omega}\cos(\theta')] \end{pmatrix}$$

Where $t_p'=2n_1 \cos(\theta')/[n_1 \cos(\theta'')+n_2 \cos(\theta')]\cdot 2n_2 \cos(\theta'')/[n_2 \cos(\theta)+\cos(\theta'')]$, $t_s'=2n_1 \cos(\theta')/[n_1 \cos(\theta')+n_2 \cos(\theta'')]\cdot 2n_2 \cos(\theta'')/[n_2 \cos(\theta'')+\cos(\theta)]$, $n_2$ is the refractive index of STO, and $\theta''$ is the refracted angle in the thin film-substrate interface. Here, $t_p'$ and $t_s'$ are Fresnel's coefficients that represent amplitude ratio of 2 interfaces that second harmonic field goes through. The second harmonic field parallel and perpendicular to the plane of incidence is given by:

$$E_\parallel^{2\omega} = E_1^{2\omega} \text{ and } E_{195}^{2\omega} = E_2^{2\omega}$$

Considering that the SHO thin film has single domain, the SHG intensity is given by $$I_\parallel^{2\omega} = C|E_\parallel^{2\omega}|^2 \text{ and } I_\perp^{2\omega} = C|E_\perp^{2\omega}|^2$$

Where C is constant. The equation above contains C and $E_0$, which can act as a scaling factor and can be removed by defining effective SHG d tensor, $d_{ij}^{eff} = \sqrt{C}E_0^2 d_{ij,s}^{Voigt}$. To minimize the fitting parameter, $d_{15}$ was included in the scaling factor and the values of the ratio of d tensor, $D_{ij} = d_{ij}/d_{15}$, were obtained from the modeling. The result of modeling gave: $D_{31}=0.94\pm0.02$ and $D_{33}=-11.47\pm0.38$.

Electrode deposition: Electrodes for electrical testing were patterned by double layer photolighography and DC sputter deposition of platinum (Pt). Polydimethylglutarimide based LOR5A (Micro-Chem Corp., Newton, Mass.) was used for the first layer, and SPR3012 (Micro-Chem Corp., Newton, Mass.) for the second layer. Both layers were deposited by spin coating at 4000 RPM for 45 seconds to achieve layer thicknesses of 1 µm. After deposition of LOR5A the sample was baked on a hot plate at 180° C. for 5 minutes. After the deposition of SPR3012, the sample was baked on a hot plate at 90° C. for 2.5 minutes. The photoresist was then exposed using a Karl-Suss MA/BA6 (Süss MicroTec AG, Garching, Germany) contact alignment tool and shadow mask, exposing the resist to ultraviolet light with a wavelength of 400 nm for 8 seconds at a lamp power of 8 mW/cm$^2$. The photoresist was then developed at room temperature for 70 seconds in a commercial developing solution, MF-CD26 Developer, (Dow Chemical Co., Midland, Mich.).

Prior to Pt deposition the samples were treated with an oxygen plasma ash cleaning step using a M4L RF Gas Plasma system (PVA, TePla) for 2 minutes with 200 W RF powder, 150 sm$^3$/sec oxygen, 50 sm$^3$/sec helium and a 550 mTorr regulated chamber pressure. The Pt top electrodes were deposited with a Kurt J. Lesker CMS-18 vacuum sputter machine at room temperature under vacuum with an Ar chamber pressure of 5 mTorr. A throw distance of 120 mm and a DC bias of 4.4 W/cm$^2$ achieved a deposition rate of 2.4 Å/s. A deposition time of 417 s was used to achieve a Pt thickness of 100 nm. Following film deposition, photolithographic lift-off was performed by submerging the samples in acetone for 15 minutes. Samples were then rinsed in DI water and submerged in MF-CD26 Developer for 2 minutes. Samples were then rinsed with DI water and blow dried with compressed nitrogen.

Dielectric Measurements: Dielectric permittivity and loss tangent measurements were made at low (sub-coercive) electric fields with a 4284A precision LCR meter (20 Hz-1 MHz) (Hewlett Packard Co., Palo Alto, Calif.) using an AC frequency from 100 Hz-1 MHz and amplitude of 30 mV. For Rayleigh measurements, the AC driving electric field magnitude was varied between 30 mV and 1.2 V and frequencies between 10 kHz to 1 MHz were tested. A pA meter/DC voltage source 4140B (Hewlett Packard Co., Palo Alto, Calif.) was used for current (I)-Voltage (V) measurements with a controlling software package GADD (Materials Research Institute, The Pennsylvania State University, University Park, Pa.). I-V measurements conducted as a function of temperature were carried out on probe station with a heated stage, heated by a C1000 Heat Exchanger and DC100 Power source (The Micromanipulator Company Inc., USA). The Rayleigh analysis was fit to the minor polarization electric field loops using the following equation:

$$P = (\varepsilon_{int} + \alpha E_{AC})E \pm \frac{\alpha}{2}(E_{AC}^2 - E^2).$$

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A ferroelectric induced piezoelectric material having a piezoelectric response ($d_{33}$) of greater than about 5.2 pm V$^{-1}$ wherein the piezoelectric material comprises a metastable SrHfO$_3$ polymorph with a P4 mm structure and wherein the polymorph is grown on a substrate suitable for epitaxial growth of the polymorph; and wherein the substrate is SrTiO$_3$.

2. The material of claim 1 wherein the polymorph has a breakdown strength of greater than about 25 MV/cm.

3. The material of claim 1 wherein the polymorph is capable of a piezoelectric response ($e_{33}$) of at least 8.8 C m$^{-2}$.

4. The material of claim 1 having an average coercive field of about 83 kVcm$^{-1}$ and a remnant polarization of about 1.2 μCcm$^{-2}$.

5. The material of claim 1 wherein the polymorph is epitaxially stabilized by a substrate upon which the polymorph is grown.

6. A method for making a lead-free piezoelectric material comprising the steps of using pulsed laser deposition to grow epitaxial films from a SrHfO$_3$ target on a SrTiO$_3$ substrate wherein the lead-free piezoelectric material has a response of 5.2 pm V$^{-1}$ for a 35 nm film, wherein the film comprises a metastable SrHfO$_3$ polymorph with a P4 mm structure and identifying the lead-free piezoelectric material comprising a piezoelectric tensor ($e_{ij}^{max}$) of greater than 3 C m$^{-2}$ by using density functional theory (DFT); and identifying a substrate that is capable of epitaxially stabilizing the piezoelectric material.

7. The method of claim 6 wherein the growth takes place at a temperature of greater than about 450° C.

8. The method of claim 6 wherein the growth takes place at a total pressure of about 100 mTorr oxygen.

9. The method of claim 6 wherein the growth takes place by using a pulse rate of the laser of between about 10 and about 40 Hz.

10. The method of claim 6 wherein the lead-free piezoelectric material has a breakdown strength of greater than about 25 MV/cm.

11. The method of claim 6 wherein the lead-free piezoelectric material is a film that is capable of a ferroelectric-induced large signal effective converse piezoelectric response of 5.2 pm V$^{-1}$.

12. The method of claim 6 wherein the lead-free piezoelectric material has an average coercive field of about 83 kVcm$^{-1}$ and a remnant polarization of about 1.2 μCcm$^{-2}$.

* * * * *